United States Patent
Wikus et al.

(10) Patent No.: US 9,995,510 B2
(45) Date of Patent: Jun. 12, 2018

(54) PULSE TUBE COOLER SYSTEM WITH FORCE-COMPENSATED ROTARY VALVE LINE

(71) Applicant: Bruker BioSpin GmbH, Rheinstetten (DE)

(72) Inventors: Patrick Wikus, Nuerensdorf (CH); Steffen Bonn, Zürich (CH); Gerhard Roth, Rheinstetten (DE)

(73) Assignee: Bruker BioSpin GmbH, Rheinstetten (DE)

( * ) Notice: Subject to any disclaimer, the term of this patent is extended or adjusted under 35 U.S.C. 154(b) by 0 days. days.

(21) Appl. No.: 15/418,233

(22) Filed: Jan. 27, 2017

(65) Prior Publication Data

US 2017/0138644 A1    May 18, 2017

Related U.S. Application Data

(63) Continuation of application No. PCT/EP2015/067219, filed on Jul. 28, 2015.

(30) Foreign Application Priority Data

Jul. 29, 2014 (DE) .................. 10 2014 214 819

(51) Int. Cl.
  *F25B 9/14*    (2006.01)
  *F25B 9/10*    (2006.01)
(52) U.S. Cl.
  CPC ............. *F25B 9/145* (2013.01); *F25B 9/10* (2013.01); *F25B 2309/1418* (2013.01)
(58) Field of Classification Search
  CPC .............. F25B 9/145; F25B 2309/1418; F25B 2309/14181; F25B 2309/1405;
  (Continued)

(56) References Cited

U.S. PATENT DOCUMENTS 3,743,328 A * 7/1973 Longfellow ............ F16L 11/15
                                                                    138/122
5,406,753 A * 4/1995 Grenci .................... B23P 11/02
                                                                    135/127
(Continued)

FOREIGN PATENT DOCUMENTS

DE         19648253 A1    6/1998
DE    102005004269 A1    8/2006
(Continued)

OTHER PUBLICATIONS

International Search Report and Written Opinion in counterpart International Application No. PCT/EP2015/067219, dated Oct. 12, 2015, 11 pages (both in German and in English).

*Primary Examiner* — Elizabeth Martin
*Assistant Examiner* — Zachary R Anderegg
(74) *Attorney, Agent, or Firm* — Edell, Shapiro & Finnan, LLC

(57) ABSTRACT

A connecting device in a pulse tube cooler system branches such that a first line branch (11) has a first flexible line segment (4*a*) and a second line branch (12) has a second flexible line segment (4*b*), the flexible line segments being arranged in parallel with and offset from one another. The flexible line segments each have a front segment end (17, 18) and a rear segment end (19, 20), the front segment end (17) of the first flexible line segment (4*a*) and the rear segment end (20) of the second flexible line segment (4*b*) are rigidly connected to one another, the rear segment end (19) of the first flexible line segment (4*a*) and the front segment end (18) of the second flexible line segment (4*b*) are rigidly connected to one another, and there is no continuous rigid connection between the control valve and the cold head.

14 Claims, 11 Drawing Sheets

(58) Field of Classification Search
CPC ... F16L 11/22; F16L 9/14; F16L 9/147; F16L 9/19–9/21; F28F 2265/30; F28F 9/013; F15C 1/06
USPC .......................................... 62/6; 138/120, 155
See application file for complete search history.

(56) References Cited

U.S. PATENT DOCUMENTS

| | | |
|---|---|---|
| 5,913,888 A | 6/1999 | Steinmeyer et al. |
| 5,966,944 A | 10/1999 | Inoue et al. |
| 7,279,900 B2 | 10/2007 | Roth |
| 2004/0040315 A1* | 3/2004 | Koyama ............... F16K 11/076 62/6 |
| 2005/0126187 A1* | 6/2005 | Li ........................... F25B 9/14 62/6 |
| 2006/0254288 A1 | 11/2006 | Schlenga |
| 2007/0107445 A1* | 5/2007 | Boesel ................. F25D 19/006 62/51.1 |
| 2012/0292548 A1 | 11/2012 | Ogol et al. |
| 2015/0084633 A1 | 3/2015 | Garside et al. |

FOREIGN PATENT DOCUMENTS

| | | |
|---|---|---|
| DE | 102005035892 B4 | 2/2007 |
| DE | 102010001498 A1 | 8/2011 |
| EP | 1503155 A1 | 2/2005 |
| GB | 2502203 A | 11/2013 |

\* cited by examiner

PULSE TUBE COOLER SYSTEM WITH FORCE-COMPENSATED ROTARY VALVE LINE

CROSS REFERENCE TO RELATED APPLICATIONS

This is a Continuation of International Application PCT/EP2015/067219, which has an international filing date of Jul. 28, 2015, and the disclosure of which is incorporated in its entirety into the present Continuation by reference. The following disclosure is also based on and claims the benefit of and priority under 35 U.S.C. § 119(a) to German Patent Application No. 10 2014 214 819.7, filed Jul. 29, 2014, which is also incorporated in its entirety into the present Continuation by reference.

FIELD OF THE INVENTION

The invention relates to a pulse tube cooler system comprising a control valve configured to switch in alternation a high-pressure reservoir and a low-pressure reservoir of a working gas to a cold head via a connecting device.

BACKGROUND

Nuclear magnetic resonance (NMR) equipment, in particular NMR spectrometers and NMR tomographs, require strong magnetic fields, which are often generated by superconducting magnet coils. The superconducting magnet coils must be operated at a cryogenic temperature. So-called pulse tube coolers are often used to maintain the operating temperature over a long period of time.

Pulse tube coolers are based on a periodic pressure fluctuation in a so-called cold head. A control valve connects a high-pressure reservoir and a low-pressure reservoir of a working gas to the cold head in alternation, with the switching frequency of the control valve typically being approximately 1-2 Hz. The pressures in the high-pressure and low-pressure reservoir are maintained by a compressor. The cold head protrudes into the cryostat of the NMR apparatus and is mounted on the cryostat.

The NMR measurements can be disturbed by mechanical vibrations of the NMR apparatus introduced via the cold head.

It has become known from DE 10 2005 035 892 B4 to provide a flexible line segment in the high-pressure line connecting the compressor to a high-pressure reservoir and in the low-pressure line connecting the compressor to a low-pressure reservoir. The pressure reservoirs, the control valve, the cold head and the cryostat together form a vibration-isolated system. The control valve is mechanically rigidly connected to the cryostat. With this design, the transfer of vibrations from the compressor to the cold head and also interference due to the pressure pulses are minimized. Disturbances originating in the control valve, in the connecting line between the control valve and the cold head or in the cold head itself are not isolated from the cryostat with this design.

Low-frequency vibrations can also be caused by the pressure fluctuations in the working gas at a frequency of approximately 1-2 Hz in a connecting line between the control valve and the cold head.

DE 10 2005 004 269 A1 describes a pulse tube cooler system, wherein the control valve is not rigidly connected to the cold head and the cryostat. A connecting line between the control valve and the cold head branches off to two line segments that are combined in such a way that pressure pulses are compensated vectorially. The line segments lead into the cold head on opposite ends, wherein the front parts of the two line segments lie on a line.

High-frequency mechanical vibrations (typically at a few hundred Hz or more) emanate from the control valve of a pulse tube cooler because of the switching mechanics (for example, rotary mechanics with an electric motor). The connecting line between the control valve and the cold head may be designed to be flexible in order not to transfer these vibrations to the cold head. A length of approximately 50 cm or more is usually necessary for this.

If the connecting line leading to the cold head were branched and if the line segments connected to the cold head were designed to be flexible and were arranged in opposition on a line, it would be readily possible to prevent mechanical vibrations on the cold head, but the design size of the branched connecting line (connecting device) would be very expansive and would no longer be compact enough for many applications.

SUMMARY

One object of the present invention is to present a pulse tube cooler system in which both high-frequency vibrations of the control valve and low-frequency vibrations due to pressure fluctuations can be suppressed in a connecting device between a control valve and a cold head in a compact design.

This object is achieved by a pulse tube cooler system of the type defined in the introduction, which is characterized in that: the pulse tube cooler system comprises a control valve configured to switch in alternation a high-pressure reservoir and a low-pressure reservoir of a working gas to a cold head via a connecting device including: a first line branch having a first flexible line segment; a second line branch having a second flexible line segment the flexible line segments are arranged parallel to one another and are offset relative to one another across the longitudinal direction of the flexible line segments,
the connecting device has a front region and a rear region with respect to a longitudinal direction of the first and second flexible line segments, wherein: the first and second flexible line segments are mutually parallel and mutually offset along the longitudinal direction; and the first and second flexible line segments each include a front segment end in the front region and a rear segment end in the rear region, wherein:
the front segment end of the first flexible line segment is rigidly connected to the rear segment end of the second flexible line segment, the rear segment end of the first flexible line segment is rigidly connected to the front segment end of the second flexible line segment, and there is no continuous rigid connection between the control valve and the cold head. Stated differently, these respective connections between the various segment ends are less flexible than are the first and second line segments, but there is no continuous less flexible connection between the control valve and the cold head.

With the design of the pulse tube cooler system according to the invention, the control valve is connected to the cold head by a special connecting device with which high-frequency vibrations of the control valve can be isolated and also low-frequency vibrations caused by the pressure fluctuations in the connecting device can be compensated in a small space.

A continuous rigid connection between the control valve and the cold head is omitted in order not to transfer high-frequency vibrations from the control valve to the cold head. The connection between the control valve and the cold head is established only with the participation of one of the flexible line segments or both flexible line segments, so that the high-frequency vibrations of the control valve are isolated. As a rule, a length of 50 cm or more of a flexible line segment is sufficient for adequate isolation of the high-frequency vibrations. The flexible line segments are preferably designed (in particular with regard to the material and the length of the line) so that the high-frequency vibrations of the control valve (at 500 Hz or more, for example) are reduced by a factor of at least 100.

On the other hand, the two flexible line segments are used to create essentially opposing mechanical forces in response to the pressure fluctuations of the working gas in the connecting device. Due to the branching of the connecting device, the flexible line segments are connected so that they are both subject to the same pressure fluctuations (as switched by the control valve) of the working gas and cause opposing longitudinal contraction forces and/or expansion forces simultaneously (synchronously) according to the instantaneous pressure of the working gas accordingly. At least one of the flexible line segments must be designed so that the working gas can flow through it.

The two flexible line segments are arranged in parallel to one another and across the longitudinal direction of the flexible line segments, so that they are offset from one another across the longitudinal direction of the flexible line segments ("side by side"), typically with little or no offset in the longitudinal direction (e.g., with an offset amounting to, at most, half of the length of a flexible line segment). The space required can be greatly reduced due to the fact that the flexible line segments do not lie on a line. It should be noted that the two flexible line segments in general run in a straight line. Within the scope of the present invention, the two line branches (with their partially rigid line segments and the two flexible line segments) and optional mechanical rods are "folded up," so to speak, typically with some rigid line segments and/or rods running parallel to and at the side next to the flexible line segments.

To obtain opposing mechanical forces in pressure fluctuations, the front and rear segment ends of the two flexible line segments are rigidly connected to one another in a crosswise manner; rigid line segments (carrying the working gas) or a rigid linkage (not carrying any working gas) may be used for this purpose.

An expansion in length of the first flexible line segment in the longitudinal direction would be associated with a compression in length of the second flexible line segment over the rigid mechanical connections of the segment ends. Similarly, an expansion in length of the second flexible line segment caused by the rigid mechanical connections of the segment ends would be associated with a compression of length of the first flexible line segment. If both flexible line segments attempt to expand because of a simultaneous increase in pressure of the working gas, for example, then they block one another mutually. Accordingly, the two flexible line segments also block one another mutually when they both attempt to contract because of a simultaneous drop in pressure of the working gas. It is therefore effective to set up passive compensation of the low-frequency vibrations which are caused by synchronous pressure fluctuations in the working gas in both branches of the connecting device.

The synchronicity of the pressure curves in the two branches of the connecting device is ensured by the fact that the frequency of the pressure pulses to be compensated is low in comparison with the ratio of the velocity of sound in the working gas to the length of the line segments through which the flow passes.

The forces induced by the two flexible line segments can be easily set up to be the same magnitude so that there is no net force on the cold head (and/or the total cooled magnet system of a magnetic resonance apparatus) in particular by using flexible line segments of the same design. However, there always remains a certain torque on the cold head due to the transverse offset of the flexible line segments. To minimize this as much as possible, the flexible line segments are preferably arranged side by side next to one another as closely as possible.

In a preferred embodiment of the pulse tube cooler system according to the invention, it is provided that the front end of the segment of the first flexible line segment and the rear end of the segment of the second flexible line segment are rigidly connected to the cold head and/or the rear end of the segment of the first flexible line segment and the front segment end of the second flexible line segment are rigidly connected to the control valve. These rigid mechanical connections are not critical with respect to the low-frequency vibrations because of the essentially expansion-free and contraction-free design of the connecting device. Said rigid connections can be established in particular through rigid line segments ("tube pieces") through which the working gas can be passed.

An embodiment in which the control valve is designed as a rotary valve is also preferred. With a rotary valve, the periodic switching between the high-pressure reservoir and the low-pressure reservoir is especially simple. The high-frequency vibrations generated by a typical motor drive of the rotary valve can be insulated well with a flexible line segment made of corrugated metal tubing, for example.

An embodiment in which the rigid connections of the segment ends are partially or completely furnished by rigid line segments through which the working gas can flow is particularly preferred. The rigid connections between the segment ends therefore have a double function for vibration compensation and for transport of the working gas. No additional rods are required.

One embodiment of the pulse tube cooler system according to the invention provides that both line branches are designed so that working gas can flow through them. In this embodiment, both line branches are involved in the flow of gas between the control valve and the cold head so that the flow resistance for the working gas is minimized.

In a preferred refinement of this embodiment, the two line branches are designed so that they have the same flow resistance for the working gas. This can be achieved in particular by a symmetrical design of the branches. In this design the compensation effect is particularly high. Alternatively, an uneven flow resistance of the two line branches can also be set up, which is often easier to accomplish structurally.

In one alternative embodiment, only one of the two line branches is designed so that working gas can flow through it. Dead volumes (which can have a negative effect on the efficiency of the pulse tube cooler system) are therefore reduced. In many cases, this also permits structural simplification. In particular, rigid line segments (pipe pieces) are required. However, it should be noted that even in this embodiment, the two line branches and/or flexible line segments are accessible for the working gas from the high-pressure reservoir and the low-pressure reservoir (in accordance with the switch state of the control valve).

A refinement of this embodiment, in which one of the line branches on one of the segment ends is blocked from its flexible line segment, is preferred. This is very simple to implement structurally.

An embodiment in which the flexible line segments are designed as metallic corrugated tube is also advantageous. These line segments have proven successful in practice for isolation of high-frequency vibrations, with respect to their long-term stability, and are available commercially at a low cost.

In an advantageous embodiment, the flexible line segments are designed to be identical. The flexible line segments of the two line branches are of the same length in particular, have the same diameter and are made of the same material. The forces generated in the two line segments due to pressure fluctuations can therefore be approximately equalized in magnitude by a simple procedure.

An embodiment in which the connecting device is arranged so that the longitudinal direction of the flexible line segments runs horizontally is also preferred. In this design (and with the usual vertical arrangement of the cold head in the cryostat), the residual torque introduced into the cold head through the connecting device can be oriented favorably so it attempts to rotate the cold head about its vertical axis. For this purpose, the flexible line segments are arranged horizontally next to one another in a plane. Such a torque does not pull the cold head toward a wall in the cryostat. "Rattling" is prevented.

In an advantageous alternative embodiment, the connecting device is arranged so that the longitudinal direction of the flexible line segments runs vertically. This can be accomplished in a particularly space-saving manner.

In another preferred embodiment, a counterweight with which a torque on the cold head induced by the weight of the connecting device is arranged on the cold head and is used to compensate for the torque. In this way, the cold head can be held in a targeted orientation on and/or in a cryostat in a particularly simple manner.

Nested Line Branches

The object above is also achieved by a pulse tube cooler system of the type defined in the introduction, which is characterized in that: the pulse tube cooler system comprises a control valve configured to switch in alternation a high-pressure reservoir and a low-pressure reservoir of a working gas to a cold head via a connecting device including: a first line branch having a flexible line segment; a second line branch having a flexible tubular wall segment; and a front region and a rear region with respect to a longitudinal direction of the flexible line segment, wherein: the flexible line segment is arranged coaxially in the flexible tubular wall segment; and the flexible line segment and the flexible tubular wall segment each include a front segment end in the front region and a rear segment end in the rear region, wherein: the front segment end of the flexible line segment is rigidly connected to the rear segment end of the flexible tubular wall segment; and the rear segment end of the flexible line segment is rigidly connected to the front segment end of the flexible tubular wall segment. No continuous rigid connection connects the control valve and the cold head.

With this design, the flexible line segment, on the one hand, and the flexible tubular segment, on the other hand, block one another mutually with respect to an expansion in length or a compression in length based on the synchronous low-frequency pressure fluctuations in the two line branches. This blocking is achieved by the rigid connections of the front and rear segment ends crosswise in the same way as with the design with two flexible line segments as presented above. The rigid connections are typically achieved by an inner and an outer rigid tube segment. These two segments preferably also delineate the second line branch. A connection between the control valve and the cold head is not rigid mechanically but instead is isolated only by the flexible connecting segment and/or the flexible tubular segment so that high-frequency vibrations of the control valve are isolated. Application of a torque to the cold head due to pressure fluctuations in the working gas can be prevented almost completely due to the concentric nested arrangement of the flexible line segment and the flexible tubular segment. Furthermore, a compact design is achieved. It should be noted that embodiments of the design presented above, unless they improve upon the two flexible line segments, can also be applied to this further design with a flexible line segment and a flexible tubular wall segment.

A preferred embodiment of this pulse tube cooler system provides that the front segment end of the flexible line segment and the rear segment end of the flexible tubular wall segment are rigidly connected to the cold head and/or the rear segment end of the flexible line segment and the front segment end of the flexible tubular wall segment are rigidly connected to the control valve. The rigid mechanical connections of the segment ends, provided in this embodiment, to the control valve and the control head are not critical with regard to the low-frequency vibrations because of the essentially expansion-free and contract-free design of the connecting device.

Another preferred embodiment is one in which the flexible line segment and the flexible tubular wall segment are each designed with a metallic corrugated tube and the spring rates of the two corrugated tubes are designed such that the two corrugated tubes generate equal forces in the longitudinal direction with the same pressure applied by the working gas in the first and second line branches. Therefore, a practically complete compensation of the expansion in length and/or compression in length of the connecting device can be achieved.

In addition, in a preferred embodiment only the first line branch is designed so that the working gas can flow through it. This simplifies the design and dead volumes are reduced. It should be pointed out that at least one of the line branches is designed so that the working gas can flow through it and therefore the working gas can be conducted to and from the cold head, and furthermore, in general and therefore also in this specific embodiment, both line branches are accessible for the working gas, so that both line branches can participate in the compensation of expansion and compression.

In a preferred embodiment, it is provided that the second line branch comprises an inner annular space between the outside of the flexible line segment and an inner rigid tube segment and an outer annular space between the flexible tubular wall segment and an outer rigid tube segment. The flexible line segment of the first line branch here is used at the same time to limit the second line branch, which reduces the number of walls required and also avoids a rigid connection between the control valve and the cold head in a simple manner.

Magnetic Resonance

A magnetic resonance arrangement, in particular an NMR spectrometer arrangement or an NMR tomography arrangement comprising a pulse tube cooler system according to the invention, as described above, also falls within the scope of the present invention. The magnetic resonance arrangement therefore has particularly low interference and is therefore particularly suitable for high-resolution measurements. A magnetic resonance arrangement typically includes at least one magnet which is usually designed to be superconducting and to be arranged in a cryostat, and also high-frequency components, for example, HF coils in a room-temperature bore in the cryostat and a sample space for a sample to be measured.

Additional advantages of the invention are derived from the description and the drawings. Likewise, the features described above and those to be explained further below can be used individually according to the invention or several can be used in any combinations. The embodiments illustrated and described here are not to be understood as a conclusive enumeration but instead have more of an exemplary character for the description of the invention.

BRIEF DESCRIPTION OF THE DRAWINGS

The invention is illustrated in the drawings and is explained in greater detail on the basis of exemplary embodiments, in which.

DETAILED DESCRIPTION

Figure 1:
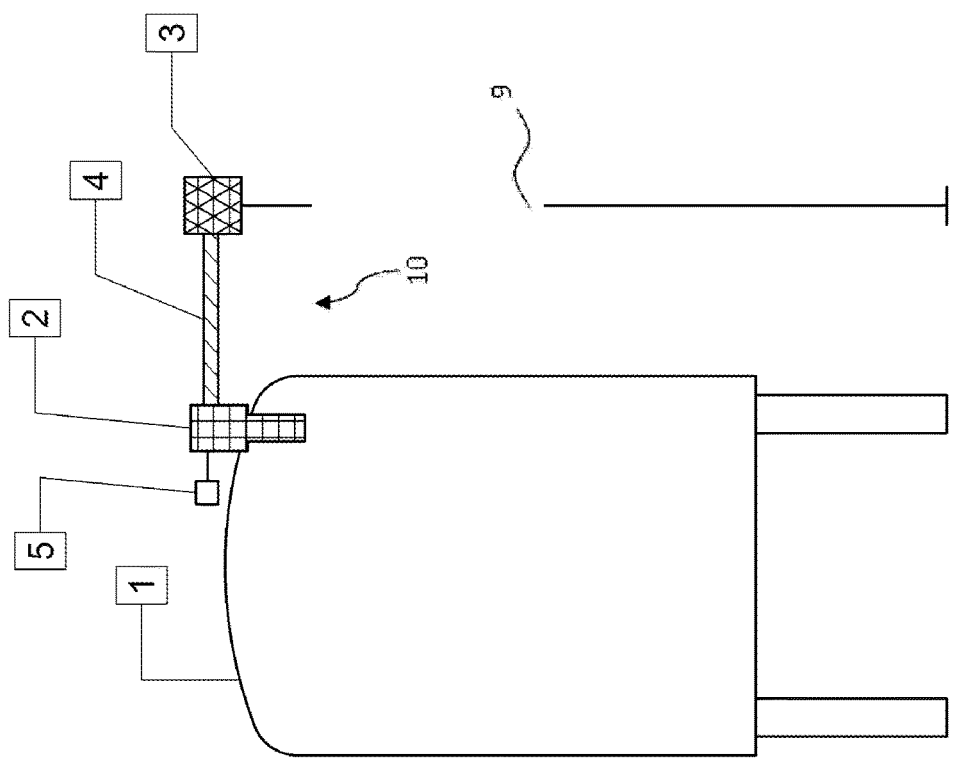
FIG. 1 shows a schematic side view of one specific embodiment of a pulse tube cooler system arranged on a cryostat of an NMR spectrometer, having a connecting device arranged horizontally.

FIG. 1 shows in a schematic side view one specific embodiment of a pulse tube cooler system 10. The pulse tube cooler system 10 serves to keep a cooling medium (for example, liquid helium) in a cryostat 1 at a cryogenic temperature (approximately 4.2 K in the case of liquid He-4). The cryogen in the cryostat 1 cools a superconducting magnetic coil, which generates a magnetic field for an NMR measurement (cf. FIG. 10 in this regard).

To cause the least possible interference in the NMR measurement, the pulse tube cooler system 10 is equipped with a control valve 3, namely a rotary valve here, which is arranged so that it is spatially separate from a cold head 2.

The control valve 3 switches a high-pressure reservoir and a low-pressure reservoir containing a working gas, mostly He-4, in alternation at a frequency of approximately 1-2 Hz (cf. in this regard FIGS. 8 and 9) to the cold head 2, which is mounted on the cryostat 1.

The control valve 3 is connected to the cold head through a connecting device 4, which is arranged horizontally, wherein the working gas can flow from the control valve 3 to the cold head and vice versa through the connecting device 4.

A counterweight 5, which balances the torque produced by the weight of the connecting device 4 on the cold head 2, is disposed on the cold head 2. In the specific embodiment shown here, the control valve 3 is mounted on a support structure 9 to position the control valve 3 at the same level as the cold head 2.

Figure 2:
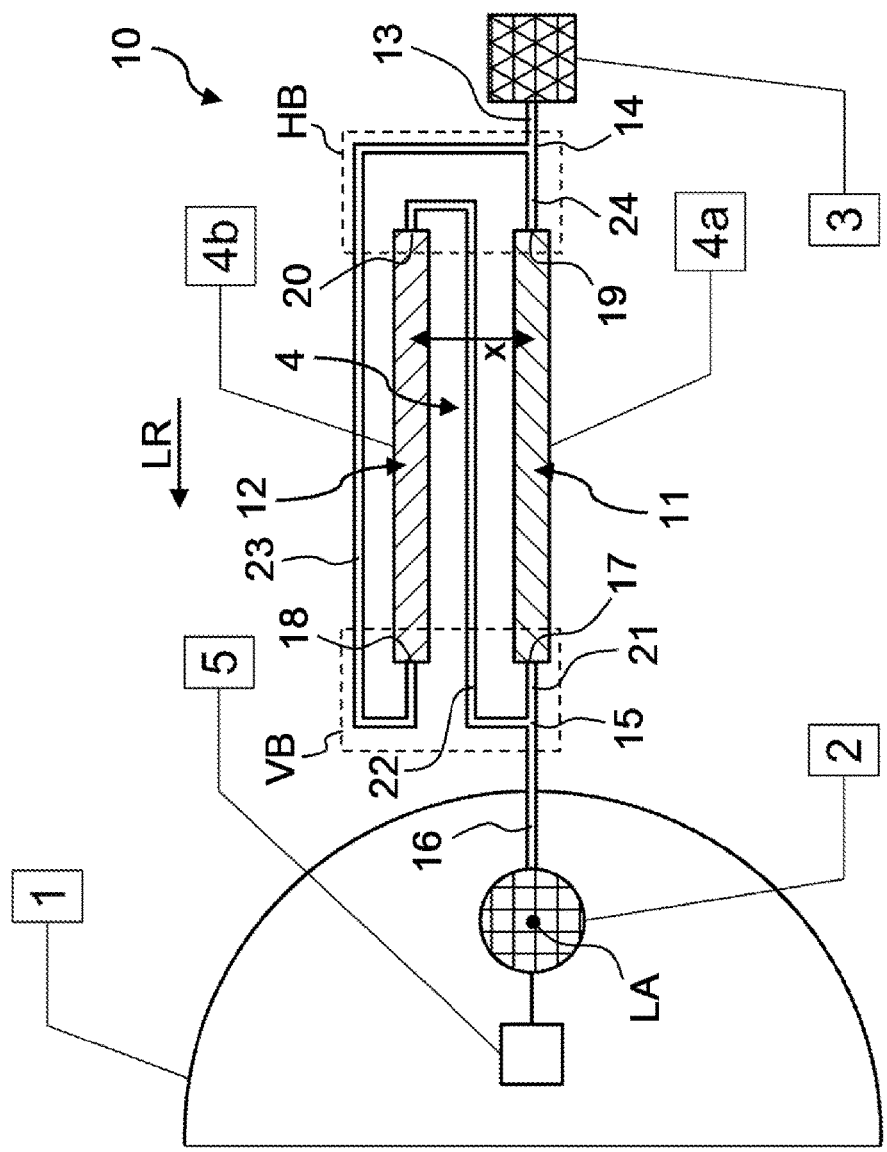
FIG. 2 shows a schematic view of the pulse tube cooler system from FIG. 1, having a straight line branch and a meandering line branch.

FIG. 2 shows, in a view from above, the design of the connecting device 4 of the pulse tube cooler system 10 in more detail.

The connecting device 4 is connected via a rigid line segment ("pipe piece") 13 to the control valve 3. This rigid line segment 13 branches at a branching point 14 to a first line branch 11, which runs straight (directly) here, and a second line branch 12, which runs in a meandering pattern ("folded up") here. The line branches 11, 12 are brought together again at a meeting point 15 and are connected to the cold head 2 via a rigid line segment 16.

The first line branch 11 contains a first flexible line segment 4a and the second line branch 12 contains a second flexible line segment 4b. The two flexible line segments ("hose pieces") 4a, 4b run parallel to one another along a longitudinal direction LR. The longitudinal direction LR is shown here as extending horizontally.

The flexible line segments 4a, 4b each have a front segment end 17, 18 in a front region VB (which is shown here as being close to the cold head 2), and have a rear segment end 19, 20 in a rear region HB (which is shown here as being close to the control valve 3).

The front segment end 17 of the first flexible line segment 4a is connected to a longer, angled, rigid line segment 22 with the meeting point 15 via a short rigid line segment 21, and the rear segment end 20 of the second flexible line segment 4b is connected to a longer, angled, rigid line segment. The segment ends 17, 20 are thus also rigidly connected mechanically to one another via the rigid line segments 21, 22.

The front segment end 18 of the second flexible line segment 4b is connected to a short straight rigid line segment 24 with the branching point 14 via a longer angled rigid line segment 23, and the rear segment end 19 of the first flexible line segment 4a with the branching point is also connected to the short line segment. The segment ends 18, 19 are thus rigidly connected mechanically to one another via the rigid line segments 23, 24.

If the control valve 3 now switches a high pressure to the two flexible line segments 4a, 4b, these line segments attempt to expand in the longitudinal direction LR. The first flexible line segment 4a here attempts to force the points 14, 15 apart from one another via the rigid line segments 21, 24. However, the second flexible line segment 4b attempts to compress the points 14, 15 via the rigid line segments 22, 23. As a result there is hardly any relative movement between the points 14, 15 due to the increase in pressure.

However, if the control valve 3 switches a low pressure to the two flexible line segments 4a, 4b, then these line segments attempt to contract in the longitudinal direction LR. The first flexible line segment 4a here attempts to contract the points 14, 15 via the rigid line segments 21, 24. However, the second flexible line segment 4b attempts to pull apart the points 14, 15 via the rigid line segments 22, 23. As a result, there is again hardly any relative movement between the points 14, 15 due to the reduction in pressure.

The expansion forces and/or contraction forces of the flexible line segments 4a, 4b thus compensate for one another mutually when there are pressure fluctuations. Since the flexible line segments 4a, 4b are identical in design, in particular the length and cross section are the same, this compensation is therefore nearly perfect and there are (approximately) no changes in length. However, the second line branch 12 is offset by the distance x transversely to the longitudinal direction LR in comparison with the first line branch 11, which can result in a torque being applied to the cold head 2, attempting to rotate the cold head about its longitudinal axis LA (running perpendicular to the plane of the drawing in FIG. 2). The (horizontal) distance x is therefore usually selected to be as small as possible in practice. It should be pointed out that in one variant of the embodiment shown here, the flexible line segments may also be arranged one above the other. In this case, the result would be a tilting moment on the cold head due to the (vertical) distance of the flexible line segments.

It should also be noted that there is no continuous rigid connection between the control valve 3 and the cold head 2. The line connection in both branches 11, 12 is accomplished by the mediation of one of the flexible line segments 4a, 4b. In this way high-frequency vibrations occurring on the control valve 3 (caused in particular by a motor drive for a rotary body) can be kept away from the cold head 2. It should be pointed out that a certain minimum length of the flexible line segments 4a, 4b, typically 50 cm or more, is necessary for this isolation function, so that the horizontal minimum distance of the control valve 3 from the cold head 2 is also determined in this embodiment.

In the embodiment shown here, working gas can flow through both line branches 11, 12. However, the second line branch 12 is approximately three times longer than the first line branch 11 and has a higher flow resistance accordingly so that much more working gas flows through the first line branch 11 than through the second line branch 12.

Figure 3:
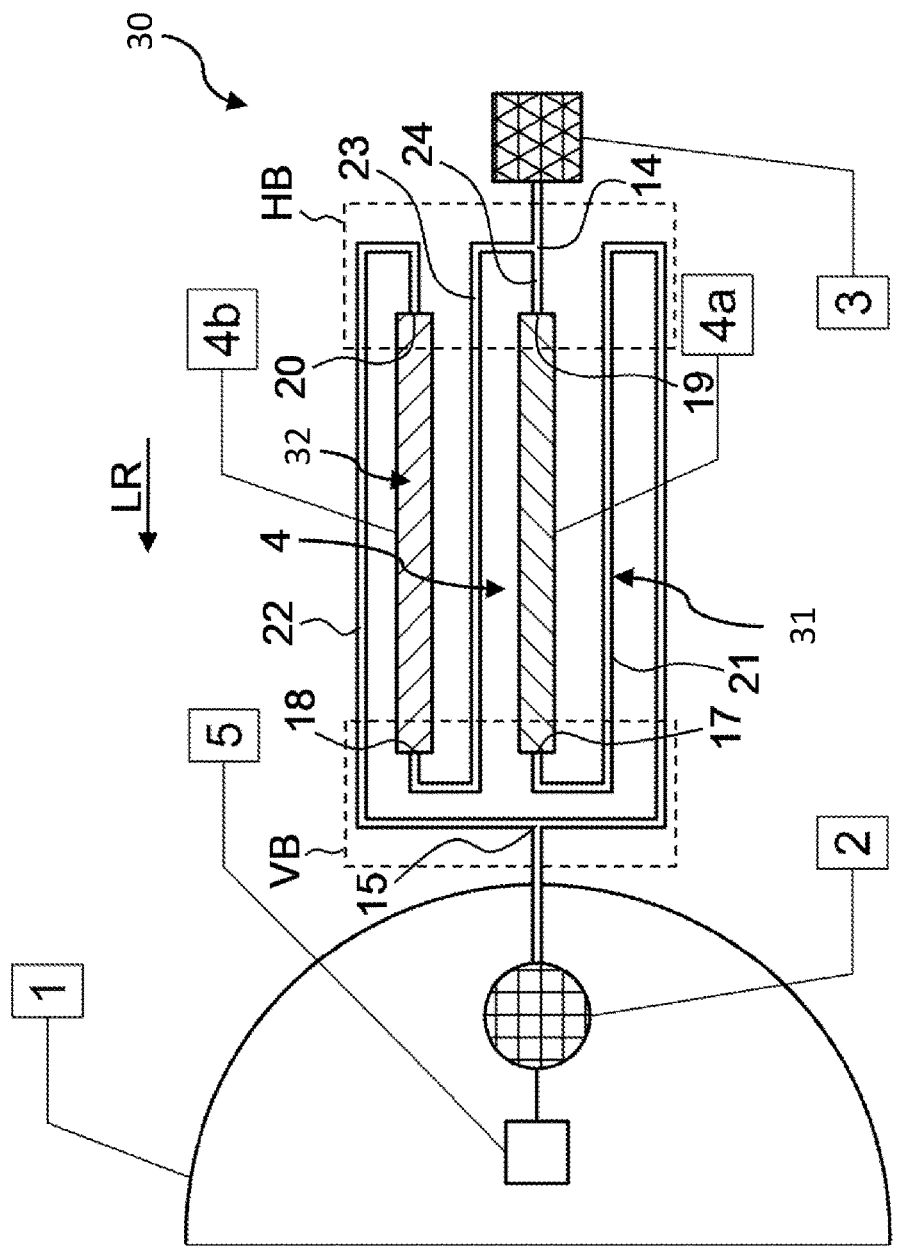
FIG. 3 shows a schematic side view of one specific embodiment of a pulse tube cooler system having two meandering line branches.

FIG. 3 shows another embodiment of a pulse tube cooler system 30, which is similar to the pulse tube cooler system 10 shown in FIG. 2. The following description of FIG. 3 highlights differences from FIG. 2.

In this embodiment, the two line branches 31, 32 of the connecting device 4 are designed to be meandering. The two line branches 31, 32 can have working gas flowing through them and each contains one of the flexible line segments 4a, 4b. The segment ends 17, 20 on the one hand and 18, 19 on the other hand are in turn rigidly connected to one another via rigid line segments 21, 22 and 23, 24. This mechanically rigid connection of the segment ends 17, 18, 19, 20 crosswise permits compensation of changes in length of the flexible line segments 4a, 4b due to pressure fluctuations, as described with regard to FIG. 2.

The two line branches 31, 32 here are of approximately the same length on the whole and are designed on the whole accordingly with approximately the same flow resistance so that approximately the same amount of working gas can flow through the two line branches 31, 32.

Figure 4:
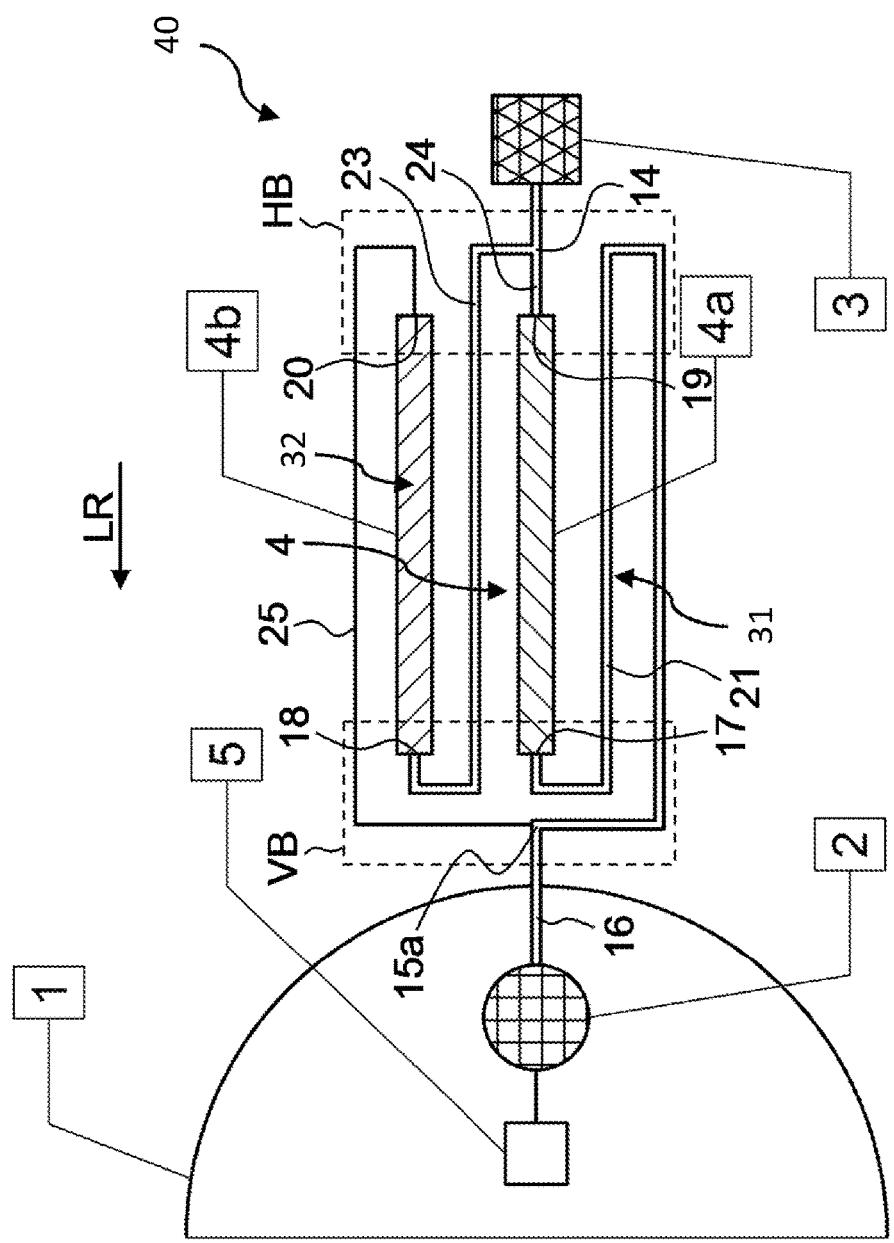
FIG. 4 shows a schematic side view of a specific embodiment of a pulse tube cooler system having a line branch through which gas can flow and having a line branch through which no gas can flow.

FIG. 4 shows another embodiment of a pulse tube cooler system 40, which is also similar to the pulse tube cooler system shown in FIG. 2. The following description of FIG. 4 highlights differences from FIG. 2.

In this embodiment, the connecting device 4 at the branching point 14 branches off to the first line branch 31 through which the flow can pass with the first flexible line segment 4a on the one hand and the second line branch 32 through which no flow can pass with the second flexible line segment 4b on the other hand.

The front segment end 18 of the second flexible line element 4b is mechanically rigidly connected to the rear segment end 19 of the first flexible line segment 4a via the rigid line segments 23, 24. The second flexible line segment 4b participates in pressure fluctuations of the working gas, as switched by the control valve 3, via the rigid line segment 23. Accordingly, the second flexible line segment 4b also attempts to expand and contract in the longitudinal direction LR in accordance with the applied pressure of the working gas.

The rear segment end 20 of the second flexible line segment 4b is designed to be closed here and is rigidly connected to the rigid line segment 21 via a rigid rod 25 through which no working gas can flow, namely being connected at the transition 15a to the rigid line segment 16 to the cold head 2. The angled rigid line segment 21 in turn leads to the front segment end 17 of the first flexible line segment 4a. Thus, the segment ends 17 and 20 are mechanically rigidly connected to one another.

This mechanically rigid connection of the segment ends 17, 18, 19, 20 "in a cross" again permits compensation of the changes in length of the flexible line segments 4a, 4b due to the pressure fluctuations in the working gas, as described in connection with FIG. 2.

Figure 5:
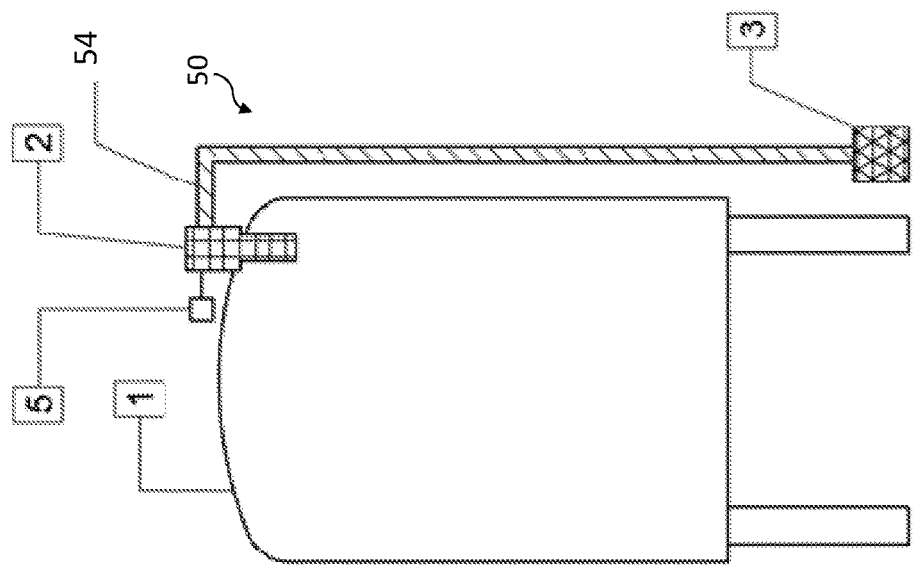
FIG. 5 shows a schematic side view of one specific embodiment of a pulse tube cooler system arranged on a cryostat of an NMR spectrometer, having a connecting device arranged vertically.

FIG. 5 shows in a schematic side view a pulse tube cooler system 50, which is similar to the pulse tube cooler system 10 shown in FIG. 1. The following description of FIG. 5 highlights differences from FIG. 1.

The control valve 3 here is arranged on the bottom (or alternatively near the bottom) while the cold head 2 is arranged on an upper part of the cryostat 1. The connecting device 54 here runs essentially vertically. The connecting device 54 and the control valve 3 can therefore approach the cryostat 1 more closely in the horizontal direction than in the embodiment in FIG. 1, so that the total design becomes more compact.

Figure 6:
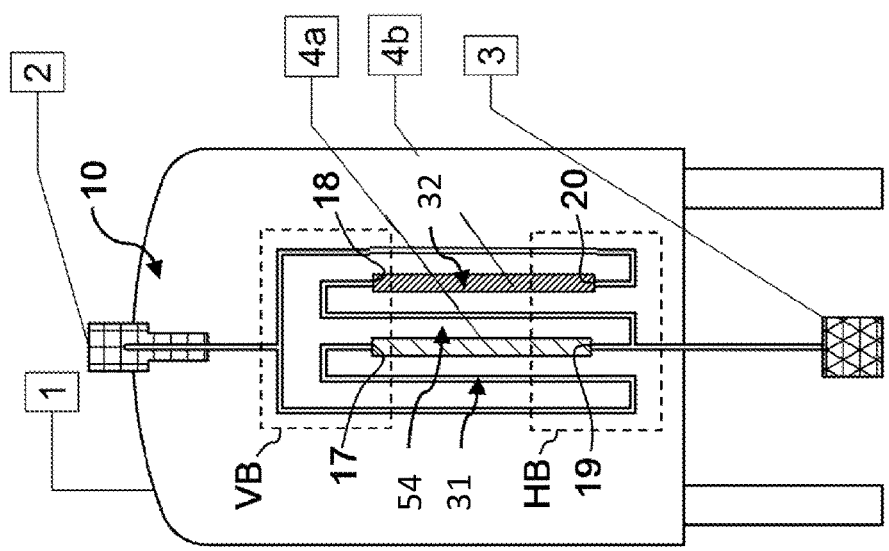
FIG. 6 shows a schematic side view of the pulse tube cooler system from FIG. 5, rotated by 90° in comparison with the view from FIG. 5, having two meandering line branches.

FIG. 6 illustrates a side view of the pulse tube cooler system 50 of FIG. 5, rotated by 90°. The connecting device 54 here is branched to its two line branches 31, 32 as shown in FIG. 3, wherein the segment ends 17, 18, 19, 20 of the two flexible lines 4a, 4b are again mechanically rigidly connected to one another in a crosswise manner (and with the pipe lines). The front region VB near the cold head 2 is arranged here at the top and the rear region HB near the control valve 3 is arranged here at the bottom.

Figure 7:
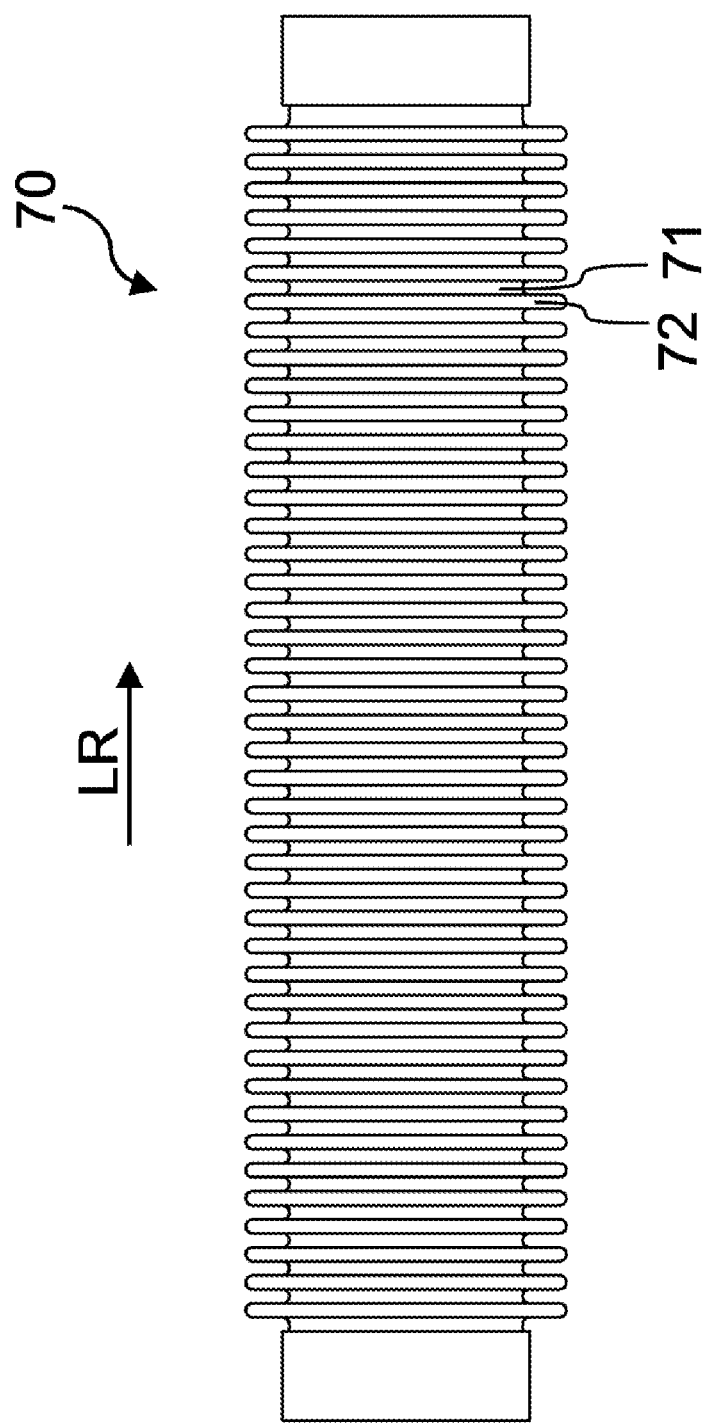
FIG. 7 shows a schematic outside view of a metallic corrugated tube.

FIG. 7 shows, in a schematic exterior view, a metallic corrugated tube 70, with which a flexible connecting segment can be designed according to the invention. The corrugated tube 70 has a sequence of multiple segments with a smaller diameter 71 and a larger diameter 72 in the longitudinal direction LR. The corrugated tube 70 can therefore be stretched or compressed with a relatively great elasticity in the longitudinal direction LR, in particular when there are changes in pressure in the interior of the corrugated tube 70. The metallic corrugated tube 70 can be manufactured in particular by welding metallic rings or by internal high-pressure forming of a straight pipe piece.

Figure 8:
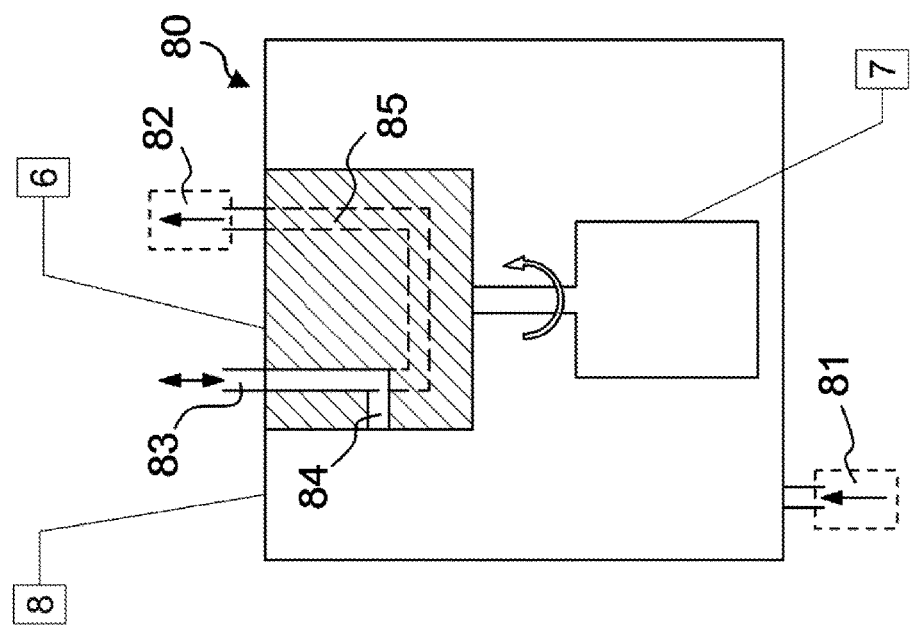
FIG. 8 shows a schematic sectional view of a rotary valve, switched to the high-pressure reservoir.

In a schematic side view, FIG. 8 shows the function of a control valve designed as a rotary valve 80 for the invention.

The rotary valve 80 has a motor 7 with which a rotary body 6 is rotated, typically at a constant rate of 0.5 to 2 revolutions per second. The rotary body 6 is arranged in a housing 8 which is connected to a high-pressure reservoir 81 (e.g., approximately 25 bar) of a working gas. In the embodiment shown here, working gas under high pressure is also provided in the housing 8. In addition, a connection to a low-pressure reservoir 82 (e.g., approximately 6 bar) of the working gas and a connection 83 to the cold head (and/or to the connecting device) is also set up on the housing 8. It should be noted that metallic corrugated tubes are typically used to connect the high-pressure reservoir 81 and the low-pressure reservoir 82 to the rotary valve 80.

In the rotary position of the rotary body 6 shown in FIG. 8, a channel 84 is opened between the connection 83 to the cold head and the interior of the housing 8 and thus to the high-pressure reservoir 81. However, a channel 85 (shown with dotted lines because it is actually rotated by 90°) to the low-pressure reservoir 82 is closed.

Figure 9:
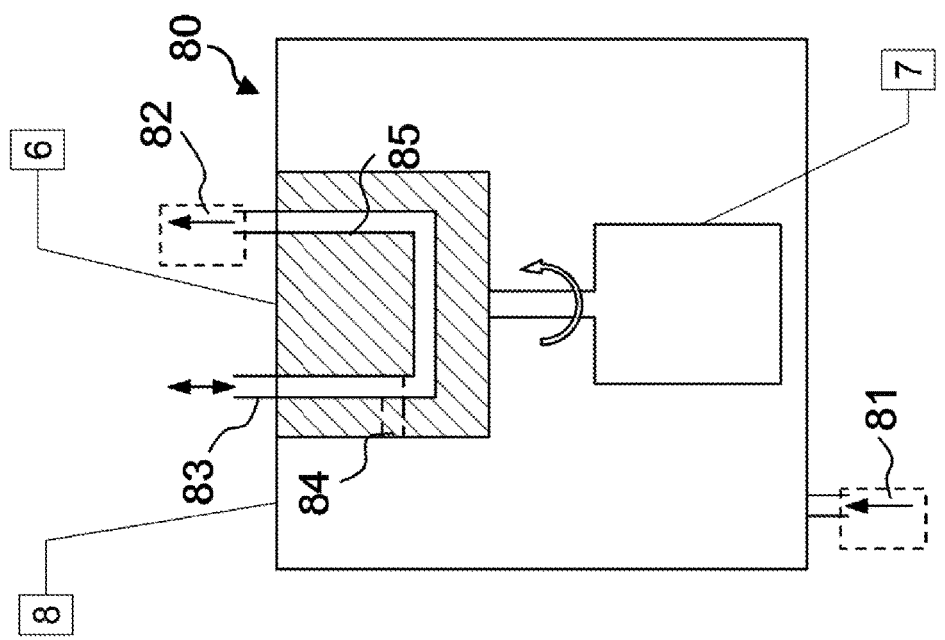
FIG. 9 shows the sectional diagram of the rotary valve from FIG. 8, switched to the low-pressure reservoir.

In the rotary position of the rotary body 6 shown in FIG. 9, the channel 85 is now open between the connection 83 to the cold head and the low-pressure reservoir 82. However, the channel 84 (shown with dotted lines because it is actually rotated by 90°) is closed.

The pressure of the working gas in the cold head can be alternately increased and reduced through a rapid change between the two rotary positions of the rotary valve 80 shown here.

Figure 10:
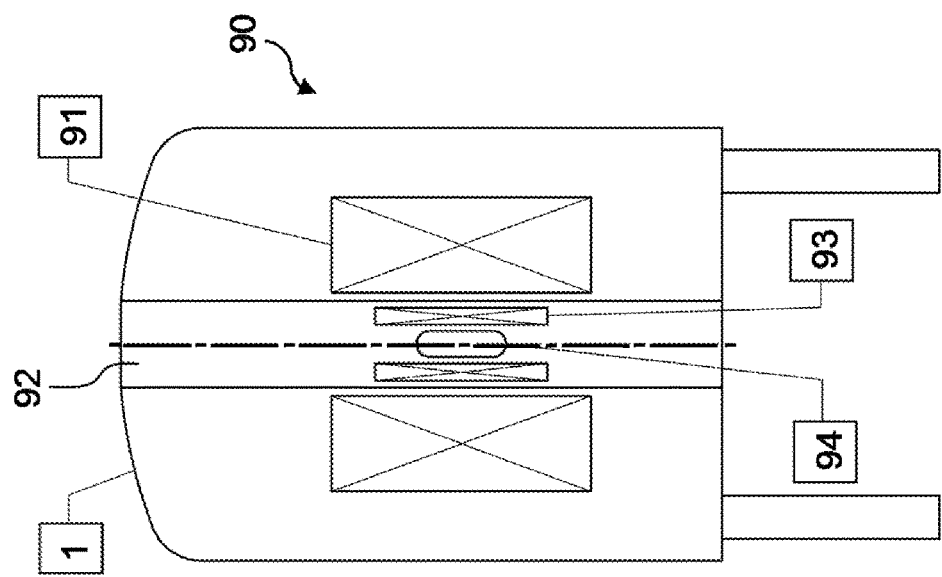
FIG. 10 shows a schematic cross-sectional view of the cryostat of the NMR spectrometer from FIG. 1.

FIG. 10 shows a magnetic resonance arrangement 90, namely an NMR spectrometer here, with which a pulse tube cooler system according to the invention can be used.

A superconducting magnet coil 91, which is kept at a cryogenic temperature below the transition temperature of the superconductor in the magnet coil 91 using a coolant (typically a liquid gas such as LHe or LN2, not shown) is arranged in a cryostat 1. The coolant can be cooled by a pulse tube cooler system according to the invention, which protrudes with a cold head into the cryostat 1 (not shown in FIG. 10; however, cf. FIG. 1 and FIG. 5 in this regard). High-frequency (HF) components 93 (e.g., HF-transmitting coils and HF-receiving coils), which enclose a sample volume 94 for a sample, on which measurements are to be performed, are arranged in a room temperature bore 92 in the cryostat 1. The magnet 91 generates a strong homogeneous magnetic field Bo, for example, 5 tesla or more, which is required for the NMR measurement in the sample volume 94.

Figure 11:
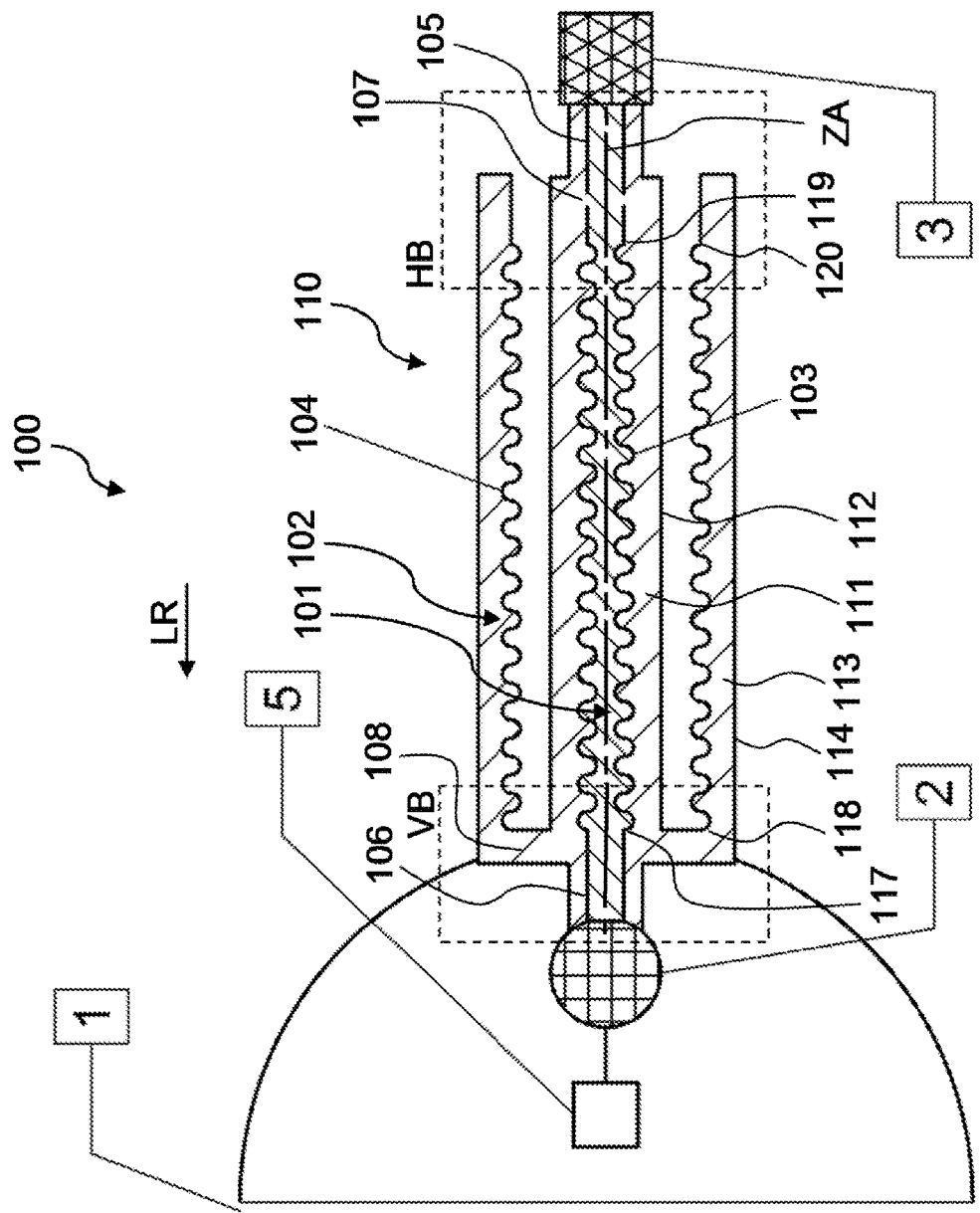
FIG. 11 shows a schematic partial sectional view of one specific embodiment of a pulse tube cooler system, in which the components of the connecting device are arranged concentrically.

In a schematic view from above, FIG. 11 shows an alternative embodiment of a pulse tube cooler system 100, which is similar to the pulse tube cooler system 10 shown in FIG. 2, with the connecting device 110 being shown in a sectional view. The following description of FIG. 11 highlights differences from FIG. 2. The volumes of the connecting device 110 through which gas flows are shown with hatching in FIG. 11.

The connecting device 110, which is essentially rotationally symmetrical with respect to a central axis ZA, comprises a first straight line branch 101, which is formed in the embodiment shown here by a first rigid pipe piece 105, a flexible line segment 103, formed here by a metallic corrugated tube, and a second rigid pipe piece 106. The first line branch 101 can have working gas flowing directly through it, then flowing from the control valve 3 to the cold head 2 and back again.

The connecting device 110 additionally comprises a second line branch 102 which is designed essentially by an inner annular space 111 and an outer annular space 113 in the embodiment shown here. The annular spaces 111, 113 are nested one inside the other and are arranged coaxially (concentrically) with respect to the central axis ZA.

The inner annular space 111 is bordered on the inside radially essentially by the rigid pipe pieces 105, 106 and the flexible line segment 103, and bordered on the outside by an inner rigid pipe segment 112. The outer annular space 113 is bordered on the inside radially by a flexible tubular segment 104, formed here by a metallic corrugated tube, and on the outside by an outer rigid pipe segment 114.

The inner annular space 111 is connected to the first line branch 101 ("branching points" for the working gas) at two through-holes 107 here. The outer annular space 113 is also connected to the inner annular space 111 by an annular passage 108 for the working gas. The second line branch 102 does not have working gas flowing through it here, but instead ends as a "dead end" close to the rear segment end 120 of the flexible tubular wall segment 104.

The flexible line segment 103 and the flexible tubular wall segment 104 are nested one inside the other and are arranged coaxially (concentrically) with respect to the central axis ZA, extending essentially along the longitudinal direction LR, which is parallel with the central axis ZA, from a rear region HB up to a front region VB of the connecting device 110. The front end segment 117 of the flexible line segment 103 is connected here rigidly to the rear end segment 120 of the flexible tubular wall segment 104 via the cold head 2 and the outer rigid pipe segment 114. In addition, the front segment end 118 of the flexible tubular wall segment 104 is rigidly connected here to the rear segment end 119 of the flexible line segment 103 via the inner rigid pipe segment 112, the control valve 3 and the rigid pipe piece 105.

The corrugated tube of the flexible line segment 103 and the corrugated tube of the flexible tubular wall segment 104 have spring rates adapted to one another, so that the pressure occurring with the working gas on both corrugated tubes (essentially the same overall pressure in both line branches 101, 102) leads in the longitudinal direction LR to a force and counterforce of the same magnitude on the connecting device 110 and/or between the control valve 3 and the cold head 2. Therefore on the whole the expansion forces and compression forces of the flexible line segment 103 on the one hand and the flexible tubular wall segment 104 on the other hand are compensated when the working gas in the first and second line branches 101, 102 is exposed to synchronous pressure fluctuations. In the embodiment shown here, the flexible line segment 103 and the flexible tubular wall segment 104 have the same length in the longitudinal direction LR. For adaptation of the spring rates here, the wall thickness of the corrugated tube is selected to be thinner in the flexible tubular wall segment 104 than in the flexible lime segment 103 (not shown in detail here). It should be noted that the spring rates (spring resistance values) can be adjusted on the basis of various factors, not only by the wall thickness in the radial direction, for example, but also by the tubing material or the bellows geometry of the respective corrugated tube.

Due to the coaxial (concentric) arrangement of the flexible parts of the first and second line branches 101, 102, the minor residual torque caused in the embodiment shown in FIG. 2 by the transverse offset of the lines 4a and 4b is entirely eliminated.

What is claimed is:
1. A pulse tube cooler system comprising:
    a cold head, a control valve configured to switch in alternation a high-pressure reservoir and a low-pressure reservoir of a working gas to the cold head, and a connecting device, wherein:
the connecting device branches into a first line branch and a second line branch,
the first line branch has a first line segment and the second line branch has a second line segment,
the first and the second line segments are mutually parallel and mutually offset along a longitudinal direction of the line segments,
the connecting device has a front region and a rear region with respect to the longitudinal direction,
the first and the second line segments have respective front segment ends in the front region and respective rear segment ends in the rear region,
the front segment end of the first line segment is connected to the rear segment end of the second line segment via a first connection,
the rear segment end of the first line segment is connected to the front segment end of the second line segment via a second connection,
the first and the second connections are less flexible than are the first and the second line segments, and
no continuous connection that is less flexible than are the first and the second line segments connects the control valve and the cold head.

2. The pulse tube cooler system as claimed in claim 1, wherein:
the front segment end of the first line segment and the rear segment end of the second line segment are connected to the cold head via a third line segment, wherein the third line segment is less flexible than are the first and the second line segments, and/or
the rear segment end of the first line segment and the front segment end of the second line segment are connected to the control valve via a fourth line segment, wherein the fourth line segment is less flexible than are the first and the second line segments.

3. The pulse tube cooler system as claimed in claim 1, wherein the control valve is a rotary valve.

4. The pulse tube cooler system as claimed in claim 1, wherein:
the front segment end of the first line segment is connected to the rear segment end of the second line segment by a third line segment configured to transport the working gas, wherein the third line segment is at least in part less flexible than are the first and the second line segments, and
the rear segment end of the first line segment is connected to the front segment end of the second line segment by a fourth line segment configured to transport the working gas, wherein the fourth line segment is at least in part less flexible than are the first and the second line segments.

5. The pulse tube cooler system as claimed in claim 1, wherein the first and the second line branches are configured to transport the working gas.

6. The pulse tube cooler system as claimed in claim 5, wherein the first and the second line branches have at least substantially same respective flow resistances for the working gas.

7. The pulse tube cooler system as claimed in claim 1, wherein only one of the first or the second line branches is configured to transport the working gas.

8. The pulse tube cooler system as claimed in claim 7, wherein the first line branch is blocked from the first line segment at the front or the rear segment ends, or the second line branch is blocked from the first line segment at the front or the rear segment ends.

9. The pulse tube cooler system as claimed in claim 1, wherein the first and the second line segments are metallic corrugated tubes.

10. The pulse tube cooler system as claimed in claim 1, the first and the second line segments are mutually at least substantially identical.

11. The pulse tube cooler system as claimed in claim 1, wherein the longitudinal direction of the line segments is horizontal.

12. The pulse tube cooler system as claimed in claim 1, wherein the longitudinal direction of the line segments is vertical.

13. The pulse tube cooler system as claimed in claim 1, wherein the cold head includes a counterweight configured to compensate for torque induced by the weight of the connecting device on the cold head.

14. A magnetic resonance arrangement comprising the pulse tube cooler system as claimed in claim 1.

* * * * *